(12) United States Patent
Racz et al.

(10) Patent No.: US 10,374,196 B2
(45) Date of Patent: Aug. 6, 2019

(54) LIGHTING DEVICE WITH COLOR SCATTERING LAYER AND METHOD FOR PRODUCING A LIGHTING DEVICE

(71) Applicant: OSRAM Opto Semiconductors GmbH, Regensburg (DE)

(72) Inventors: David Racz, Regensburg (DE); Guenter Spath, Regensburg (DE); Markus Richter, Burglengenfeld (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/306,966

(22) PCT Filed: Apr. 30, 2015

(86) PCT No.: PCT/EP2015/059455
§ 371 (c)(1),
(2) Date: Oct. 26, 2016

(87) PCT Pub. No.: WO2015/166022
PCT Pub. Date: Nov. 5, 2015

(65) Prior Publication Data
US 2017/0054110 A1    Feb. 23, 2017

(30) Foreign Application Priority Data
Apr. 30, 2014    (DE) .................. 10 2014 106 074

(51) Int. Cl.
*H01L 51/52*    (2006.01)
*H01L 33/44*    (2010.01)
(Continued)

(52) U.S. Cl.
CPC ...... *H01L 51/5268* (2013.01); *H01L 27/0248* (2013.01); *H01L 27/322* (2013.01);
(Continued)

(58) Field of Classification Search
CPC ............ H01L 51/5268; H01L 51/5275; H01L 51/5237; H01L 51/56; H01L 27/322;
(Continued)

(56) References Cited

U.S. PATENT DOCUMENTS 8,890,140 B2    11/2014  Eberhardt et al.
8,952,390 B2    2/2015   Wirth et al.
(Continued)

FOREIGN PATENT DOCUMENTS

CN    1823428 A    8/2006
CN    103503179 A    1/2014
(Continued)

*Primary Examiner* — Thao X Le
*Assistant Examiner* — Gardner W. S. Swan
(74) *Attorney, Agent, or Firm* — Slater Matsil, LLP (57) ABSTRACT

A lighting device and a method for producing a lighting device are disclosed. In an embodiment, the lighting device includes a carrier, at least one optoelectronic illuminant arranged on the carrier, the illuminant configured to emit light into an emission area and a color scattering layer located in the emission area, the color scattering layer configured to generate a color by scattering of light at a surface of the color scattering layer facing away from the illuminant.

8 Claims, 10 Drawing Sheets

(51) Int. Cl.
    *H01L 27/02*   (2006.01)
    *H01L 27/32*   (2006.01)
    *H01L 51/56*   (2006.01)
    *H01L 25/075*   (2006.01)
    *H01L 33/50*    (2010.01)

(52) U.S. Cl.
    CPC .......... *H01L 33/44* (2013.01); *H01L 51/5237* (2013.01); *H01L 51/5275* (2013.01); *H01L 51/56* (2013.01); *H01L 25/0753* (2013.01); *H01L 33/505* (2013.01); *H01L 2924/0002* (2013.01)

(58) Field of Classification Search
    CPC ... H01L 27/0248; H01L 33/44; H01L 33/505; H01L 2924/0002; H01L 25/0753
    See application file for complete search history.

(56) References Cited

U.S. PATENT DOCUMENTS

| | | | |
|---|---|---|---|
| 9,444,022 B2 | 9/2016 | Eisert et al. | |
| 9,755,117 B2 | 9/2017 | Hikmet et al. | |
| 2004/0120155 A1* | 6/2004 | Suenaga | H01L 24/49 362/362 |
| 2007/0013291 A1* | 1/2007 | Cok | B82Y 20/00 313/501 |
| 2007/0018102 A1 | 1/2007 | Braune et al. | |
| 2009/0236621 A1 | 9/2009 | Chakraborty | |
| 2010/0237775 A1* | 9/2010 | Chao | H01L 33/504 313/506 |
| 2011/0031516 A1* | 2/2011 | Basin | H01L 33/507 257/98 |
| 2011/0309393 A1* | 12/2011 | Greenwood | H01L 33/486 257/98 |
| 2013/0221389 A1* | 8/2013 | Yamamuro | H01L 33/50 257/98 |
| 2014/0367633 A1* | 12/2014 | Bibl | G02F 1/133603 257/13 |

FOREIGN PATENT DOCUMENTS

| | | |
|---|---|---|
| DE | 102010009456 A1 | 9/2011 |
| DE | 102010038396 A1 | 1/2012 |
| DE | 102011050450 A1 | 11/2012 |
| DE | 102012104148 A1 | 11/2013 |
| JP | 2000076908 A | 3/2000 |
| JP | 2001189105 A | 7/2001 |
| JP | 2010524220 A | 7/2010 |
| JP | 2011009480 A | 1/2011 |
| JP | 2011515851 A | 5/2011 |
| JP | 2012138425 A | 7/2012 |
| JP | 2012226892 A | 11/2012 |
| JP | 2013065812 A | 4/2013 |
| JP | 2013105942 A | 5/2013 |
| JP | 2013159004 A | 8/2013 |
| JP | 2013175531 A | 9/2013 |
| JP | 2014067965 A | 4/2014 |
| JP | 2014072309 A | 4/2014 |
| WO | 2012160107 A2 | 11/2012 |
| WO | 2012067200 A1 | 5/2014 |
| WO | 2013054658 A1 | 3/2015 |
| WO | 2014030342 A1 | 7/2016 |

\* cited by examiner

LIGHTING DEVICE WITH COLOR SCATTERING LAYER AND METHOD FOR PRODUCING A LIGHTING DEVICE

This patent application is a national phase filing under section 371 of PCT/EP2015/059455, filed Apr. 30, 2015, which claims the priority of German patent application 10 2014 106 074.1, filed Apr. 30, 2014, each of which is incorporated herein by reference in its entirety.

TECHNICAL FIELD

The invention relates to a lighting device and to a method for producing a lighting device.

BACKGROUND

In the case of a carrier on which for example light emitting diodes are arranged, in general color differences or inhomogeneities may occur, for example due to the substrate or the carrier, a metallization, conversion layers (for example phosphor layers), or wires, and may be perceived as optically disturbing for an observer. This is the case particularly when the light emitting diode is switched off, that is to say is not emitting light.

Therefore, there is a need to reduce or even completely avoid inhomogeneities in the optical impression.

SUMMARY OF THE INVENTION

Embodiments provide a lighting device which overcomes the known disadvantages and comprises a more homogenous optical impression.

Further embodiments provide a corresponding method for producing a lighting device.

According to one aspect, a lighting device is provided, comprises a carrier, on which is arranged at least one optoelectronic illuminant for emitting light into an emission area, wherein a color scattering layer for generating a color by means of a scattering of light at a surface of the color scattering layer facing away from the illuminant is formed in the emission area.

In accordance with a further aspect, a method for producing a lighting device is provided, the method comprising the following steps: arranging an optoelectronic illuminant for emitting light into an emission area on a carrier, and forming a color scattering layer for generating a color by means of a scattering of light at a surface of the color scattering layer facing away from the illuminant into the emission area.

Embodiments of the invention thus encompasses in particular the concept of forming or arranging a color scattering layer in the emission area of the optoelectronic illuminant. As a result, for example, in an advantageous manner, a homogenous optical impression may be brought about when the scattering layer is viewed in the direction of the optoelectronic illuminant. This is because possible inhomogeneities, contrasts or different colors are advantageously covered or at least partly covered by the color scattering layer. In particular, the color scattering layer advantageously brings about an optical compensation of possible inhomogeneities. A homogenous visual impression is thus brought about in an advantageous manner. This is the case particularly when the optoelectronic illuminant is not emitting light, that is to say is switched off, that is to say is in a switched-off operating state.

This more homogenous overall impression is brought about in particular by virtue of the fact that the color scattering layer reflects or scatters only specific wavelengths or a specific wavelength range of incident light. The non-reflected and/or non-scattered wavelength range is preferably absorbed. Therefore, the color scattering layer reflects or scatters (in the case of scattering, reflection is always intended to be concomitantly inferred, and vice versa) light incident on its surface facing away from the illuminant only in a specific wavelength range. A specific color impression thus arises in an advantageous manner. This is advantageous particularly for design reasons (in particular with regard to an industrial design). In particular, a color is generated as a result. By way of example, the color scattering layer may comprise color scattering media. Said color scattering media may be for example particles (which may also be designated as color scattering particles) which may reflect or scatter light in a specific wavelength range. The color reflected or scattered by the color scattering layer may be used as identification for the designation of the color scattering layer. In the case of a scattering of red, the color scattering layer may be designated as a red color scattering layer. In the case of a scattering of white, the color scattering layer may be designated as a white color scattering layer. The particles may be titanium dioxide and/or aluminum oxide particles, for example. Particularly in the case of a white color scattering layer, a luminous efficiency in the case of a switched-off state of the illuminant may be increased.

A color scattering layer within the meaning of the present invention is therefore configured, in particular, to reflect and/or to scatter a specific wavelength or a specific wavelength range of an electromagnetic radiation incident on the color scattering layer and to absorb the non-reflected and/or non-scattered (that is to say the residual or remaining) wavelength range. As a result, a specific color impression is thus generated in an advantageous manner. This is the case particularly in a switched-off state of the illuminant.

In particular, the invention is particularly advantageous for panel-based products. In particular, it brings about a homogeneity of the brightness and the color of the lighting device in the switched-off state of the illuminant, that is to say the state in which the illuminant does not emit light. A switched-on state of the illuminant denotes a state in which the illuminant emits light. The invention may advantageously also reduce production costs, particularly if the color scattering layer and/or a conversion layer are/is applied by spraying.

The emission area is in particular that area in a vicinity of the illuminant into which the illuminant emits light.

The overall visual impression may be improved particularly in the case of a switched-off illuminant. In particular, a specific color is predefined by means of the color scattering layer in the case of the switched-off illuminant. Consequently, an improved optical integration of the lighting device in a housing of a target application (for example: cellular phone, tablet, phablet) may be bought about.

According to one embodiment it may be provided that the color scattering layer is a non-fluorescent color scattering layer.

According to one embodiment it may be provided that the color scattering media are non-fluorescent color scattering media. These color scattering media may be for example non-fluorescent particles (which may also be designated as non-fluorescent color scattering particles).

According to one embodiment it may be provided that the color is white. That is to say therefore, in particular, that a white color impression is brought about. When the color scattering layer is viewed, therefore, a white overall visual impression arises. The color scattering layer thus reflects or scatters in a white wavelength range. That is to say therefore, in particular, that the color scattering layer is correspondingly configured to reflect or to scatter in this wavelength range.

In another embodiment, the color may be an arbitrary different color than white. By way of example, the color may be red, yellow, green, blue or orange. The concrete color is dependent here in particular on the concrete individual case. The color scattering layer thus reflects or scatters in a wavelength range corresponding to the color. That is to say therefore, in particular, that the color scattering layer is correspondingly configured to reflect or to scatter in this wavelength range. Particularly a use of a color apart from white may bring about a particularly high contrast (for example relative to a housing color of the lighting device, to a video wall comprising a plurality of illuminants).

According to one embodiment it may be provided that the color scattering layer is sprayed on the optoelectronic illuminant.

In another embodiment it may be provided that forming comprises spraying the color scattering layer onto the illuminant. That is to say therefore, in particular, that for example color scattering particles are sprayed on, resulting in the formation of the color scattering layer. The fact that the color scattering layer is sprayed on means therefore, in particular, that color scattering particles are sprayed onto the illuminant and/or onto the conversion layer and/or onto electronic components and/or on free regions of the carrier. This analogously applies to the conversion layer, except that there conversion particles are sprayed on.

This brings about the technical effect, in particular, that a homogeneous layer thickness may be achieved. In particular, this advantageously brings about, in a simple manner, the formation of the color scattering layer in the emission area. That simplifies and shortens a production process.

In particular, masks may be used for spraying, such that only specific areas of the carrier are sprayed with the corresponding particles (conversion particles and/or color scattering particles). Spraying thus results in a particularly high flexibility with regard to design and/or geometry since in general it is necessary only to adapt the masks for different designs or geometries.

According to another embodiment it may be provided that the optoelectronic illuminant comprises a sprayed-on conversion layer, on which the color scattering layer is sprayed.

In another embodiment it may be provided that a conversion layer is sprayed onto the optoelectronic illuminant, and wherein forming comprises spraying the color scattering layer onto the sprayed-on conversion layer.

In a further embodiment it may be provided that the conversion layer is adhesively bonded onto the illuminant or is adhesively bonded on the illuminant.

Providing a conversion layer may advantageously bring about the technical effect that independently of the wavelength of the light emitted by the optoelectronic illuminant, a different color may be generated, which is emitted by the illuminant with the conversion layer, that is to say ultimately by the lighting device. Consequently, an optoelectronic illuminant in conjunction with a corresponding conversion layer may ultimately emit a multiplicity of different colors. The conversion layer may be or comprise a phosphor layer, for example. The phosphor layer may be doped, for example. A conversion layer within the meaning of the present invention is therefore configured, in particular, to convert incident light having a first wavelength in such a way that the conversion layer generates and emits light having a second wavelength. The optoelectronic illuminant may emit blue light, for example. The conversion layer, in particular the phosphor layer, may generate green or yellow light, for example, from the blue light.

In another embodiment it may be provided that the color scattering layer is arranged in the emission area by means of a holding unit, which is formed separately from the illuminant and holds the color scattering layer.

In another embodiment it may be provided that forming comprises arranging the color scattering layer in the emission area by means of a holding unit, which is formed separately from the illuminant and holds the color scattering layer.

Therefore, a mount independent of the illuminant is advantageously provided. That is to say therefore, in particular, that the color scattering layer may be mounted on the carrier independently of the illuminant. Consequently, arbitrary illuminants may be provided, without this possibly being able to influence a corresponding arrangement of the color scattering layer in the emission area. Consequently, in an advantageous manner, for example, a universal holding unit is usable in conjunction with a multiplicity of arbitrary illuminants. A holding unit is thus universally usable for a multiplicity of illuminants. Consequently, an efficient and simple arrangement of the color scattering layer in the emission area may be brought about in a advantageous manner.

According to another embodiment it may be provided that the holding unit comprises a frame, which receives the color scattering layer and is fixed on the carrier.

According to a further embodiment it may be provided that the holding unit comprises a frame, which receives the color scattering layer and is fixed on the carrier.

A frame is a particularly mechanically stable holding means for mounting the color scattering layer. Furthermore, a frame is advantageously also mechanically readily accessible and may be fixed on the carrier in a simple manner. Therefore, a good mechanical mounting of the color scattering layer on the carrier in the emission area of the optoelectronic illuminant is brought about in an advantageous manner. It may preferably be provided that the color scattering layer is arranged or fixed on the frame before the frame is mounted or fixed on the carrier, wherein the frame with the color scattering layer is subsequently fixed on the carrier. This may advantageously simplify production of the lighting device even further.

In accordance with another embodiment it may be provided that a lens is arranged in the emission area, and wherein the frame is arranged proximally with respect to the illuminant and the lens is arranged distally with respect to the illuminant.

In another embodiment it may be provided that after fixing the frame, a lens is arranged in the emission area, such that the frame is arranged proximally with respect to the illuminant and the lens is arranged distally with respect to the illuminant.

A lens may bring about a focusing of the emitted light for example in an advantageous manner. As a result, a specific emission characteristic of the optoelectronic illuminant may be set for example in an advantageous manner. The fact that the frame is arranged proximally with respect to the illuminant and the lens is arranged distally with respect to the illuminant means, in particular, that the frame is arranged nearer to the illuminant relative to the lens. That is to say therefore, in particular, that the lens is arranged at a further distance from the illuminant than the frame. As viewed in an emission direction of the light emitted by means of the illuminant, that is to say, therefore, that the frame is arranged upstream of the lens.

According to another embodiment it may be provided that the holding unit comprises a lens arranged in the emission area, the color scattering layer being arranged on said lens.

In another embodiment it may be provided that the holding unit comprises a lens, on which the color scattering layer is arranged, wherein the lens is arranged in the emission area.

Consequently, in an advantageous manner, a usually present element of a lighting device, here the lens, is used as a mount for the color scattering layer. Therefore, an additional holding means need not necessarily be provided. Consequently, material may advantageously be saved. In particular, it may be provided that the color scattering layer is already arranged on the lens before the lens is mounted on the carrier, such that the lens and the color scattering layer may be arranged or fixed on the carrier in a common mounting step. Consequently, a mounting time may advantageously be shortened.

According to another embodiment it may be provided that the holding unit comprises a surface projection formed integrally with the carrier, an area of the color scattering layer being arranged at least indirectly on said surface projection.

In another embodiment it may be provided that the holding unit comprises a surface projection formed integrally with the carrier, an area of the color scattering layer being arranged at least indirectly on said surface projection.

Providing such a surface projection advantageously brings about a particular mechanical stability. Said surface projection is generally readily visible and particularly easily accessible in order to arrange the color scattering layer at least indirectly thereon. Mounting or production is thus advantageously simplified. In particular, a height of the surface projection is greater than a height of the optoelectronic illuminant. That is to say therefore, in particular, that the surface projection projects beyond the illuminant. If the area of the color scattering layer is thus arranged at least indirectly on such a surface projection, then the color scattering layer is also arranged above the illuminant in the emission area. That is to say therefore, in particular, that, as a result, the color scattering layer may be arranged at a distance from the illuminant. The surface projection may have a stepped shape, for example. That is to say therefore, in particular, that the area of the color scattering layer may be arranged at least indirectly on a step of the surface projection. At least indirectly arranging the area of the color scattering layer within the meaning of the present invention may mean, in particular, that the color scattering layer or the area of the color scattering layer is arranged indirectly on the surface projection. By way of example, the frame receiving the color scattering layer may be fixed on said surface projection. In particular, the color scattering layer may be arranged or fixed directly by its area on the surface projection. Preferably, a plurality of surface projections may be provided. The latter may be formed in particular identically or preferably differently.

According to one embodiment it may be provided that the surface projection is produced by means of an injection-molding or molding method.

According to another embodiment it may be provided that the color scattering layer, preferably a non-fluorescent color scattering layer, comprises a glass layer coated with a color scattering medium, preferably with a non-fluorescent color scattering medium, and/or a ceramic layer or is formed from such a glass layer and/or ceramic layer, respectively. A ceramic layer or glass layer, respectively, which reflects white light may be designated for example as a white ceramic layer or glass layer, respectively. The ceramic may be coated in particular by means of a color scattering medium, preferably by means of a non-fluorescent color scattering medium. In particular, the color scattering layer may be formed as or comprise a ceramic window. This advantageously brings about a diffuse light scattering. The glass layer may be a milk-glass layer, for example. A milk-glass layer denotes a roughened glass layer. A scattering is advantageously brought about by the roughening. The color scattering layer may preferably be formed as a glass, in particular as a milk-glass. Milk-glass denotes roughened glass.

The color scattering medium (for example color scattering particles, preferably non-fluorescent color scattering particles) may be titanium dioxide ($TiO_2$) or aluminum oxide, for example. The ceramic layer may be an aluminum oxide layer, for example. For example, such a glass layer and/or ceramic layer, respectively, may be received by the frame, wherein said frame is then fixed in particular on the carrier. In particular, said glass layer and/or ceramic layer, respectively, may be arranged by an area on a surface projection, in particular a stepped surface projection, of the carrier. In particular, such a glass layer and/or ceramic layer, respectively, may be arranged or fixed on a lens, wherein said lens is arranged in the emission area.

In a further embodiment, the color scattering layer may comprise for example a thickness of between 5 µm and 100 µm, for example between 5 µm and 20 µm.

In a further embodiment, the color scattering layer may comprise at least one element from the following group of color scattering particles: $SiO_2$, $TiO_2$ (also preferably with an additional coating), $BaSO_4$, $Al_2O_3$, $ZrO_2$, $HfO_2$, glass sphere (preferably having a diameter of between 50 nm and 5 µm).

By way of example, $SiO_2$, $TiO_2$ (also preferably with an additional coating), $BaSO_4$, $Al_2O_3$, $ZrO_2$, $HfO_2$ may be provided as scattering/reflective white material.

The particle size is for example preferably in the range of 50 nm-5 µm, particularly preferably in particular in the range of 100 nm-500 nm.

Pigments having a different body color may preferably be used in order for example to generate a desired body color different than white in plan view.

By way of example, transition metals and rare earths, oxides, sulfides, cyanides and halides may be used as inorganic pigments. These materials advantageously exhibit only absorption and no emission of the absorbed light.

A degree of filling of color scattering particles and/or dyes in the color scattering layer is preferably for example in the range of 0.05 wt %-20 wt %, for example in the range of 0.05 wt %-55 wt %.

In one embodiment, a white color scattering layer comprises $TiO_2$ particles having a degree of filling of 1 wt %, wherein the white color scattering layer comprises a thickness of between 90 µm and 110 µm, in particular a thickness of 100 µm.

In one embodiment, a white color scattering layer comprises $TiO_2$ particles having a degree of filling of 20 wt %, wherein the white color scattering layer comprises a thickness of between 15 µm-20 µm.

It generally holds true, for example, that the thicker the color scattering layer, the lower a degree of filling of color scattering particles or dyes may be in order to produce a specific color impression. By way of example, an inverse proportionality between the thickness of the color scattering layer and the degree of filling of color scattering particles and/or dyes in the color scattering layer may be provided.

By way of example, the following classes of substances are provided as organic dyes and luminescent dyes for the color scattering layer (the color scattering layer therefore comprises in particular one or more of the dyes mentioned below):

Acridine dyes, acridinone dyes, anthraquino dyes, anthracene dyes, cyanine dyes, dansyl dyes, squaryllium dyes, spiropyrans, boron-dipyrromethenes (BODIPY), perylenes, pyrenes, naphthalenes, flavins, pyrroles, porphyrins and the metal complexes thereof, diarylmethane dyes, triarylmethane dyes, nitro and nitroso dyes, phthalocyanine dyes and metal complexes of phthalocyanines, quinones, azo dyes, indophenol dyes, oxazines, oxazones, thiazines and thiazoles, xanthenes, fluorenes, flurones, pyronines, rhodamines, coumarins.

As a result, different colors may advantageously be generated depending on the chosen color scattering particles or dyes.

According to another embodiment it may be provided that the lens is mounted by means of a lens mount, wherein the lens mount is fixed on the carrier. The lens mount together with the carrier acts in particular as a housing that encapsulates and protects the individual elements on the carrier. That is to say therefore, in particular, that the carrier and the lens mount form a housing that receives the elements (or the element if only one element is arranged on the carrier).

Embodiments and/or functionalities and/or features regarding the lighting device emerge analogously from embodiments and functionalities of the method, and vice versa.

According to one embodiment it may be provided that a plurality of optoelectronics illuminants are provided. The optoelectronic illuminants may be formed for example identically or preferably differently. The optoelectronic illuminant may be for example a light emitting diode, in particular an organic light emitting diode.

According to one embodiment it may be provided that the color scattering layer is arranged in a manner covering or masking the illuminant. That is to say therefore, in particular, that the color scattering layer masks or covers the illuminant. Masking or covering within the meaning of the present invention does not necessarily mean that the color scattering layer also contacts the illuminant. However, this may be provided for example, particularly if the color scattering layer is sprayed on the optoelectronic illuminant. The color scattering layer has in particular an extent such that it covers or masks the individual elements (illuminants and possible electronic components) arranged on the carrier. In a plan view from above through the color scattering layer, a homogenous optical impression thus advantageously results.

According to another embodiment it may be provided that the color scattering layer, in addition to the illuminant, also masks further areas of the carrier, that is to say is arranged correspondingly. It may preferably be provided that the color scattering layer at least partly is sprayed onto the carrier or is sprayed on the carrier.

According to another embodiment it may be provided that at least one further electronic component is arranged on the carrier. Preferably, a plurality of electronic components may be provided. The latter may be formed in particular identically or preferably differently. An electronic component may be a protective diode, for example. Such a protective diode may advantageously afford protection against electrostatic discharges. By way of example, an electronic component may be a temperature sensor. Preferably, the color scattering layer analogously to the illuminant may also be correspondingly arranged (for example sprayed) or applied on the electronic component or be formed or arranged correspondingly at a distance, in order also to mask said electronic component and to compensate for possible inhomogeneities. As a result, an optically homogenous impression may also be brought about here in an advantageous manner.

In one embodiment, the carrier may be for example a substrate or a circuit board.

According to a further embodiment, arranging the illuminant on the carrier may comprise electrical wiring with the latter.

According to a further embodiment it may be provided that the color scattering layer is furthermore provided in free areas of the carrier. Free areas of the carrier are areas in which no illuminants or electronic components are arranged. Consequently, an even more homogenous overall visual impression may arise. In this regard, it may be provided for example that the color scattering layer is sprayed onto these areas. Therefore, both on the illuminant or the conversion layer and on the free areas, the color scattering layer is formed by means of spraying on color scattering particles.

In a further embodiment it may be provided that at least one electronic component, preferably a plurality of electronic components, is (are) potted in the carrier.

According to one embodiment, opposite side faces of the illuminant comprise no conversion layer and/or no color scattering layer. The side faces are therefore free of a conversion layer and/or a color scattering layer. This may be brought about in particular by the fact that a conversion layer (which in particular may generally be designated as a CLC layer, chip level conversion layer) or a color scattering layer is applied only on a surface of the illuminant facing away from the carrier, but not on the side faces. A color scattering layer is then applied, for example adhesively bonded, on a conversion layer applied in this way. In this regard, therefore, the side faces remain of a conversion layer and a color scattering layer.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings, wherein FIGS. 1 to 5 respectively show a point in time in a method for producing a lighting device.

Identical reference signs may be used hereinafter for identical features. Moreover, for the sake of clarity, it may be provided that not all reference signs are used in all drawings.

DETAILED DESCRIPTION OF ILLUSTRATIVE EMBODIMENTS

FIGS. 1 to 5 respectively show a point in time in a method for producing a lighting device.

Figure 1:
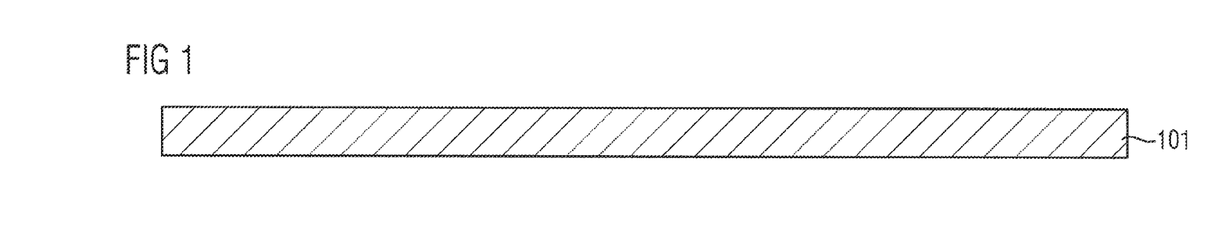

In accordance with FIG. 1, a carrier 101 is provided. The carrier 101 may be a substrate, for example. The carrier 101 may be a circuit board, for example.

Figure 2:
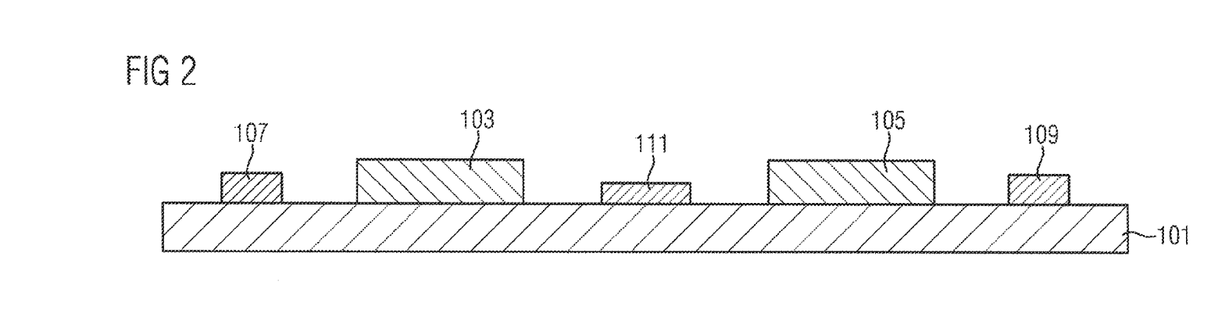

In accordance with FIG. 2, two optoelectronic illuminants 103 and 105 are arranged on the carrier 101. In this case, it is provided, in particular, that the two optoelectronic illuminants 103, 105 are electrically wired with the carrier 101. This is the case particularly if the carrier 101 is a circuit board. Analogously, two protective diodes 107 and 109 and a temperature sensor 111 as electronic components are arranged on the carrier 101 and electrically wired with the latter. The electrical wiring is generally designated as "wire bonding". In an exemplary embodiment which is not shown, more or fewer than two illuminants 103, 105 may be provided. In a further exemplary embodiment which is not shown, further electronic components may be provided in addition to or instead of the protective diodes 107, 109 and the temperature sensor 111. The selection and number shown here are not restrictive, but rather only by way of example.

In an embodiment which is not shown, the two illuminants 103 and 105 may be light emitting diodes, in particular organic light emitting diodes.

Figure 3:
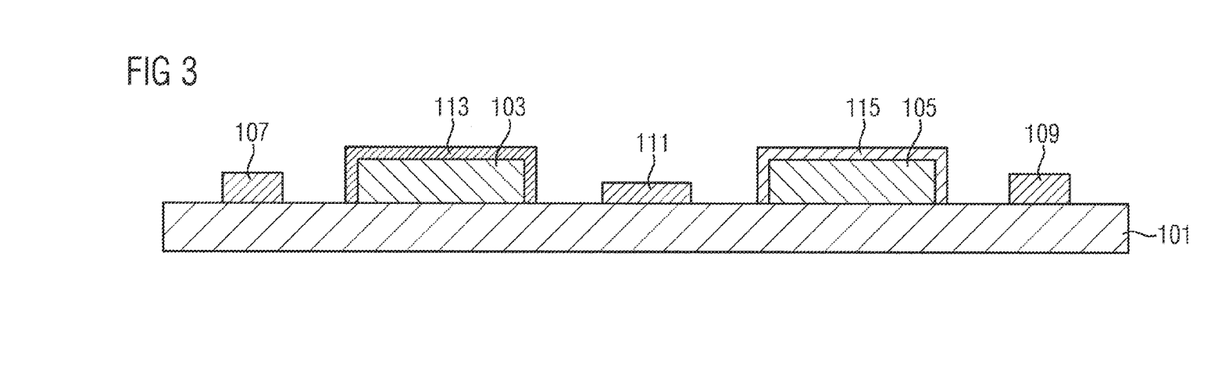

In accordance with FIG. 3, a conversion layer 113 is sprayed onto the illuminant 103. Analogously, a conversion layer 115 is sprayed onto the illuminant 105. This may be brought about for example by means of a corresponding mask that masks the illuminant which is not to be sprayed during the corresponding spraying processes. The two conversion layers 113 and 115 may for example comprise phosphor, in particular doped phosphor, or be formed as a phosphor layer 109, in particular as a doped phosphor layer.

Figure 4:
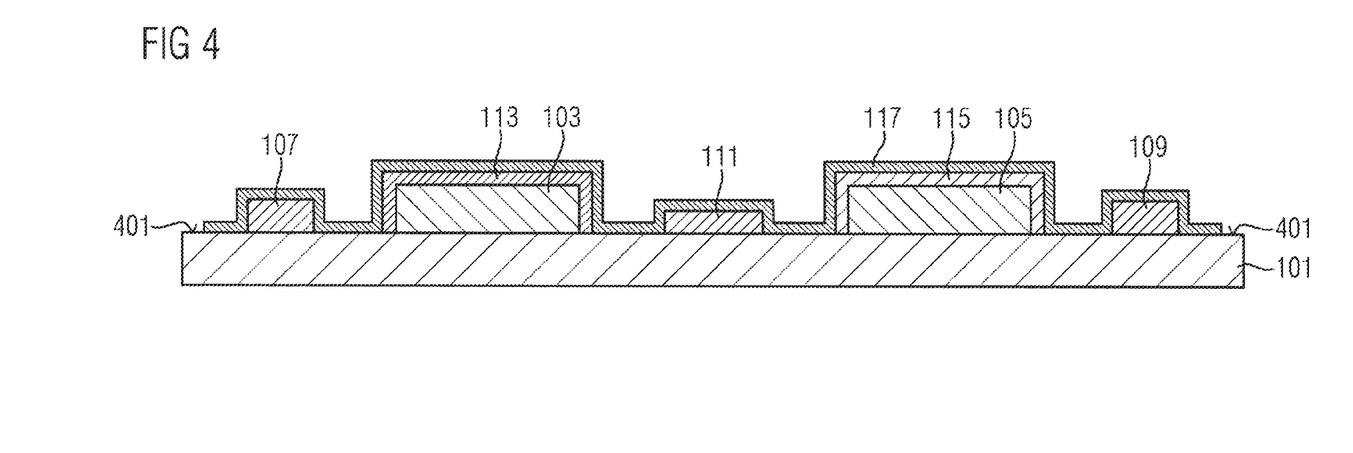

In accordance with FIG. 4, the protective diodes 107, 109, the temperature sensor 111, the two illuminants 113, 115 with their respectively sprayed-on conversion layer 113 and 115 and the areas of the carrier 101 that are correspondingly situated therebetween are provided by means of a color scattering layer 117. For this purpose, it is provided that said color scattering layer 117 is sprayed onto the individual elements and onto the areas situated therebetween, that is to say the areas situated between the above-mentioned elements. In particular, titanium dioxide may be sprayed on. This advantageously brings about the effect that a respective surface of the above-mentioned elements that are arranged on the carrier 101 is covered by means of a color scattering layer 117. This advantageously makes it possible to compensate for or mask inhomogeneities that may result for example from color differences between the individual elements. As also shown by FIG. 4, respectively opposite areas 401 of the carrier 101 remain free of the color scattering layer 117. In an exemplary embodiment which is not shown, it may be provided that a surface of the carrier 101 on which the individual elements are arranged is covered completely, that is to say entirely, by means of the color scattering layer 117.

Figure 5:
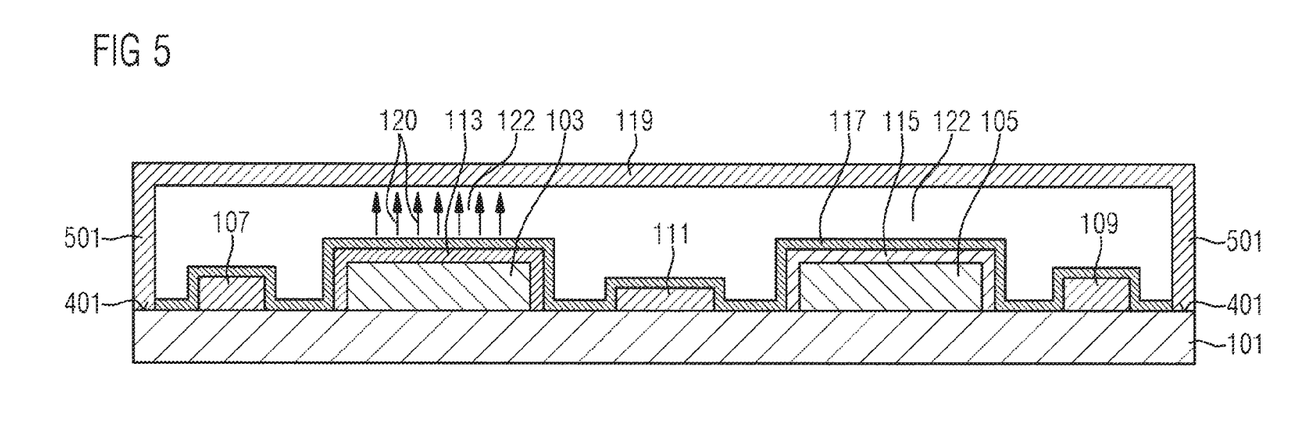

In accordance with FIG. 5, after spraying on the color scattering layer 117, a lens mount 119 is arranged on the carrier 101. The lens mount 119 comprises a lens (not illustrated in more specific detail here). In accordance with FIG. 5, the lens mount 119 comprises a U-shape comprising two parallel legs 501. The two legs 501 are respectively fixed on one of the two areas 401 of the carrier 101. In an embodiment which is not shown, it may be provided that the lens mount 119 comprises an arcuate shape or a domed shape.

If the above-mentioned steps were carried out in each case for different areas of a substrate or of a carrier 101, these areas may be separated from one another, that is to say singulated, after arranging the lens mount 119 or else after applying by means of spraying on the scattering layer 117. That is to say therefore, in particular, that said carrier is then separated or singulated into parts corresponding to said areas.

An emission direction of the emitted light is identified by way of example with several arrows having the reference sign 120 in FIG. 5. A corresponding illustration for the illuminant 105 was dispensed with, for the sake of clarity. A corresponding illustration was likewise dispensed with in the further figures, for the sake of clarity. The emission area is defined by the emission direction 120. The scattering layer 117 is formed in the emission area. The reference sign 122 indicates by way of example this emission area of the illuminant 103. This analogously applies to the illuminant 105 as well. Depiction of this emission area again in the further figures was likewise dispensed with.

Figure 6:
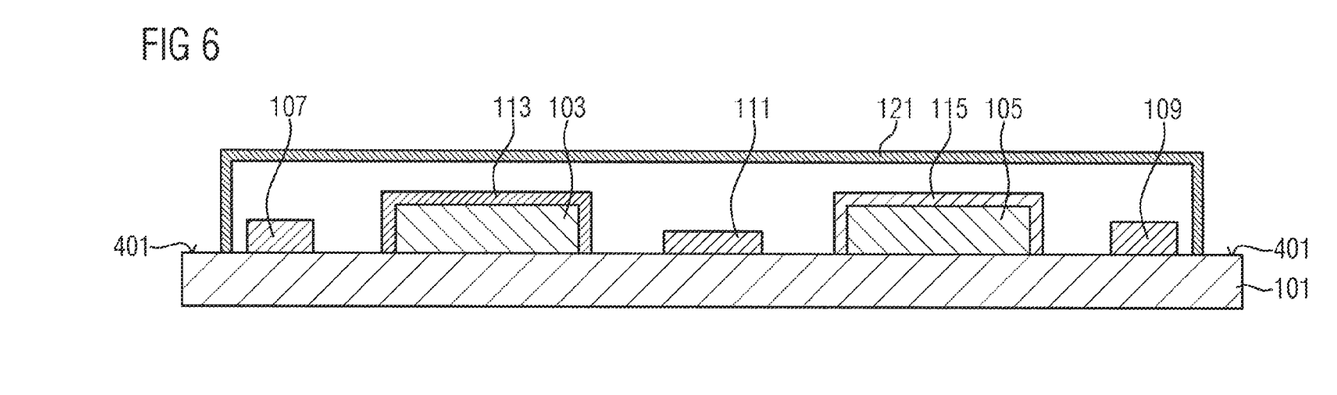
FIGS. 6 and 7 respectively show a point in time in a further method for producing a lighting device.
Figure 7:
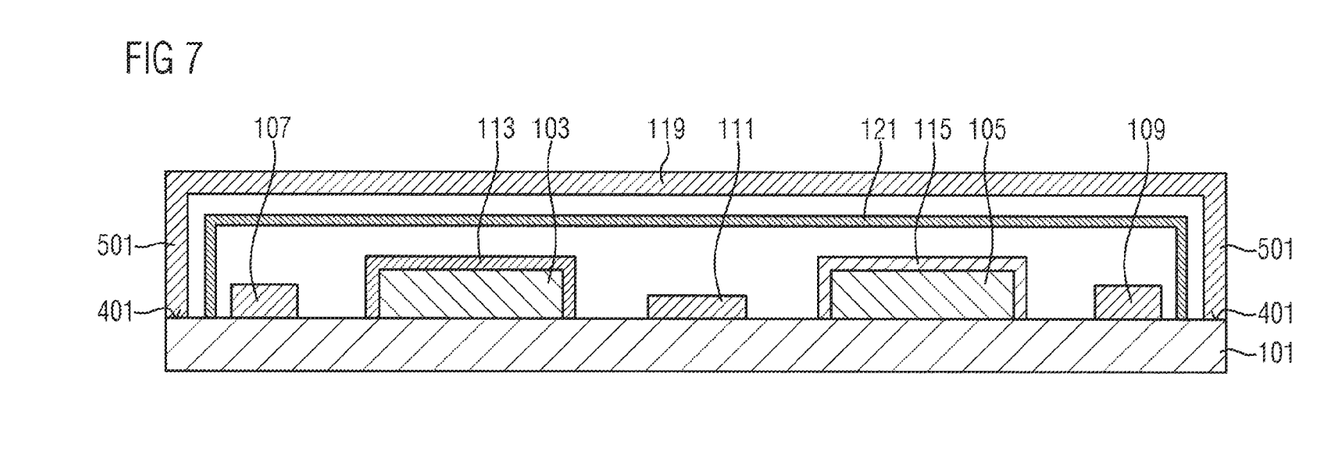

FIGS. 6 and 7 respectively show a point in time in a further method for producing a lighting device. FIGS. 1 to 3 and the corresponding explanations also apply to this further method. Reference is made to the corresponding explanations and to FIGS. 1 to 3.

In accordance with FIG. 6, now instead of spraying the individual elements with a color scattering layer, a frame 121 is fixed on the carrier 101. Said frame 121 comprises a coated glass, for example. The frame 121 may comprise for example a diffuse glass or a ceramic or a ceramic layer. In this exemplary embodiment, the coated glass, the diffuse glass and the ceramic form the color scattering layer. This color scattering layer in the form of a coated glass, a diffuse glass or a ceramic layer is not shown, for the sake of clarity. In this case, this color scattering layer 117 is arranged above the individual elements and in a manner covering the latter, analogously to the sprayed-on color scattering layer in accordance with FIG. 4. The color scattering layer 117 may be a white color scattering layer, for example. That is to say therefore, in particular, that the color scattering layer 117 reflects white light.

Analogously to FIG. 5, in accordance with FIG. 7 as well, in the further method a lens mount 119 is applied or arranged on the carrier 101. Here, too, singulating or separating of corresponding areas may be provided in accordance with the explanations given above.

Figure 8:
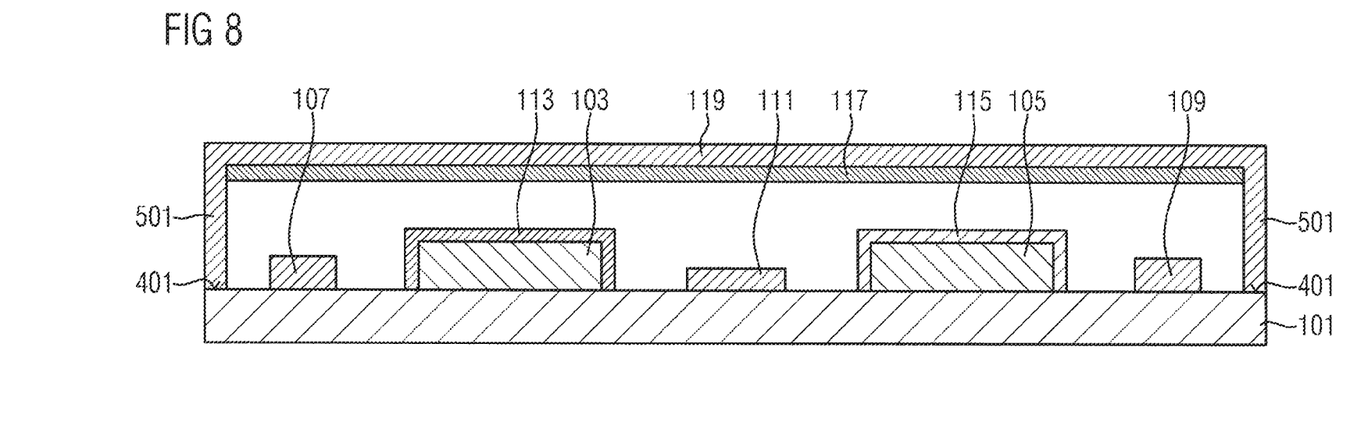
FIG. 8 shows a point in time in a different method for producing a lighting device.

FIG. 8 shows a point in time in a different method for producing a lighting device. In a manner similar to the further method in accordance with FIGS. 6 and 7, FIGS. 1 to 3 and the explanations correspondingly given apply to this different method as well. In accordance with FIG. 8, however, in a departure from FIG. 4 and FIG. 6, respectively, it is provided that a lens mount 119 comprising the color scattering layer 117 is arranged on the carrier 101. That is to say therefore, in particular, that the color scattering layer 117 is fitted or arranged on the lens mount 119. In particular, the color scattering layer 117 may be arranged on the lens (not shown). The color scattering layer 117 has an extent such that it covers the individual elements arranged on the carrier 101. In a plan view from above through the color scattering layer 117, a homogenous optical impression thus advantageously results.

FIGS. 9 to 13 show a respective point in time in another method for producing a lighting device.

Figure 9:
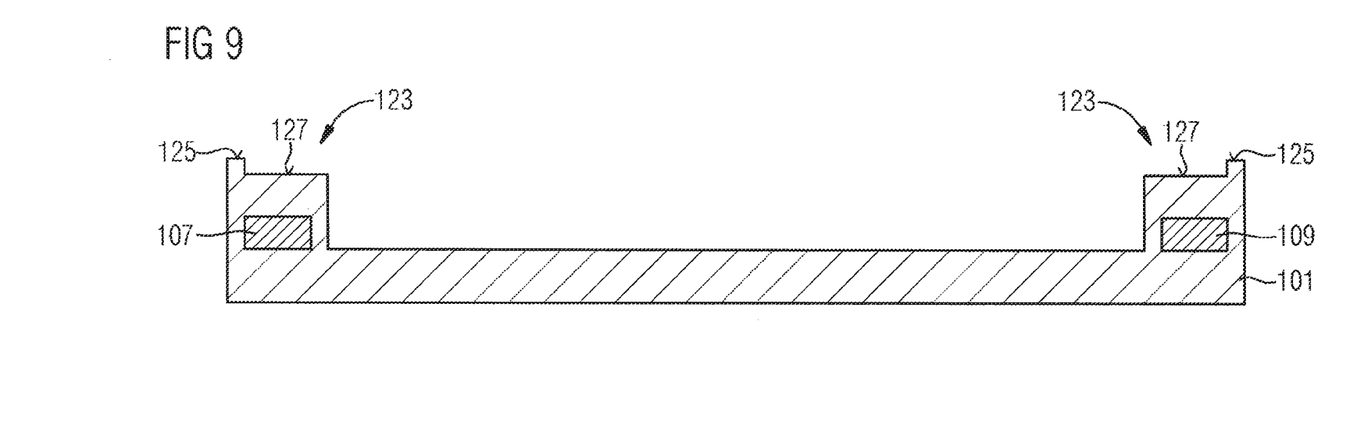
FIGS. 9 to 13 respectively show a point in time in another method for producing a lighting device.

In accordance with FIG. 9, a carrier 101 is provided. The two protective diodes 107 and 109 are potted in said carrier 101. On account of the potting (for example by means of a molding or injection-molding method/process) in particular two surface projections 123 may be provided on the carrier 101. The surface projections 123 comprise in each case two steps 125 and 127. That is to say therefore, in particular, that the two surface projections 123 may be formed by means of a potting method.

Figure 10:
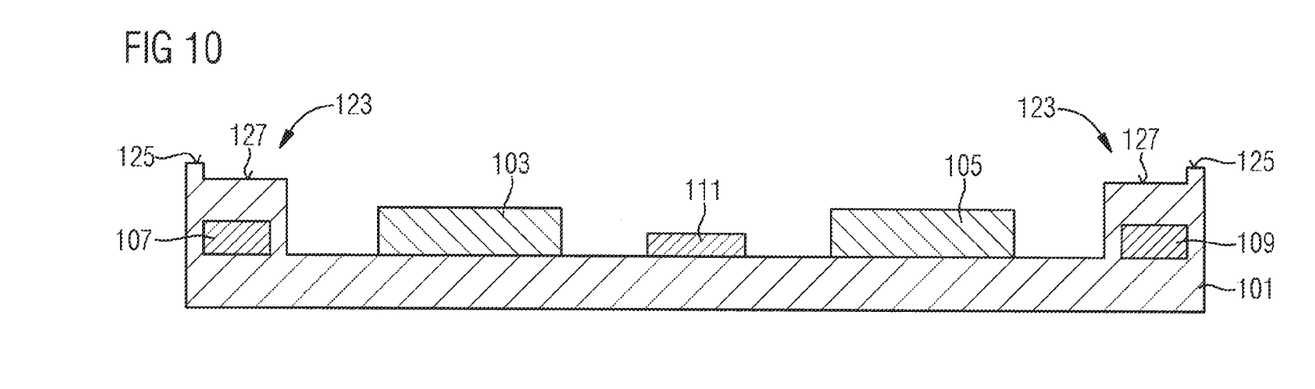

In accordance with FIG. 10, between the two surface projections 123 the two illuminants 103 and 105 and also the temperature sensor 111 are arranged on the carrier 101 and electrically wired with the latter analogously to FIG. 2.

Figure 11:
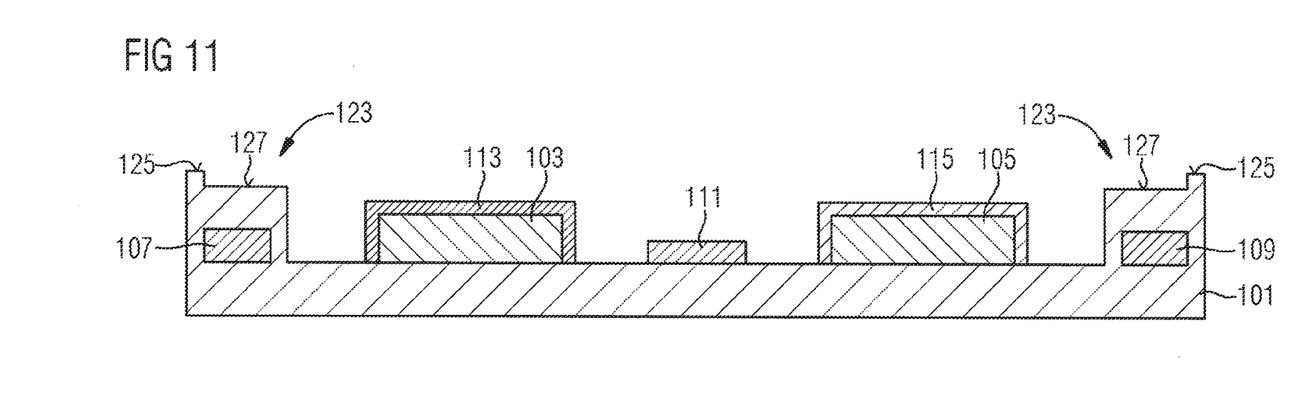

Analogously to FIG. 3, in accordance with FIG. 11, in this method as well, in each case a conversion layer 113 and 115, respectively is applied to the illuminant 103 and 105, respectively. Applying may be carried out by means of a spraying, for example. In particular, an already prefabricated conversion layer 113, 115 may be applied on the corresponding illuminant.

Figure 12:
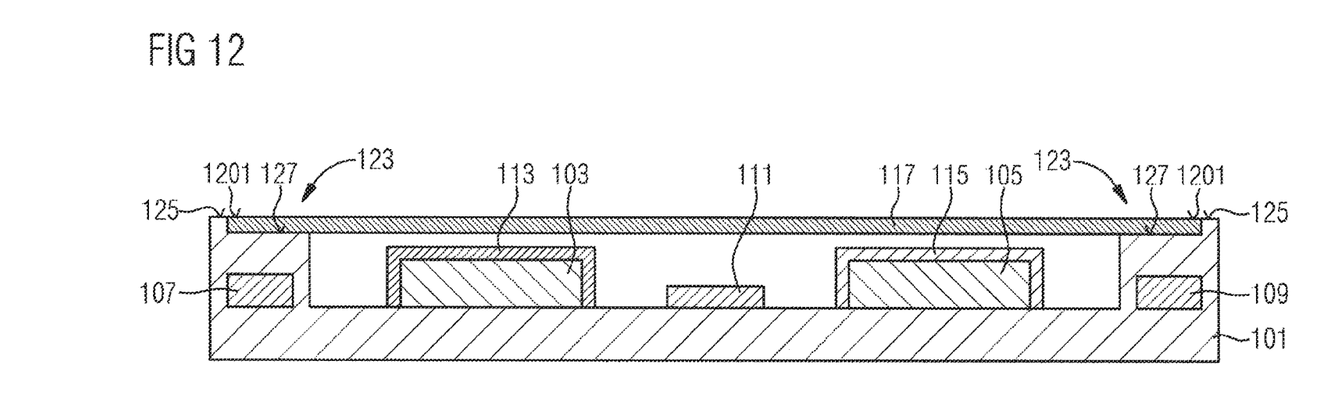

In accordance with FIG. 12, opposite end areas 1201 of a color scattering layer 117 are arranged on the steps 127. The color scattering layer 117 here may be for example a white coated glass or a white ceramic layer. The end areas 1201 may be adhesively bonded onto the two steps 127, for example. Correspondingly, in particular a frame may be placed or arranged on these two steps 127, wherein the frame holds a colored coated, in particular white coated, glass or a colored, in particular white, ceramic layer. The glass may be milk-glass, for example. This is the case in particular generally also in a manner detached from this concrete exemplary embodiment. Milk-glass denotes a roughened glass.

Figure 13:
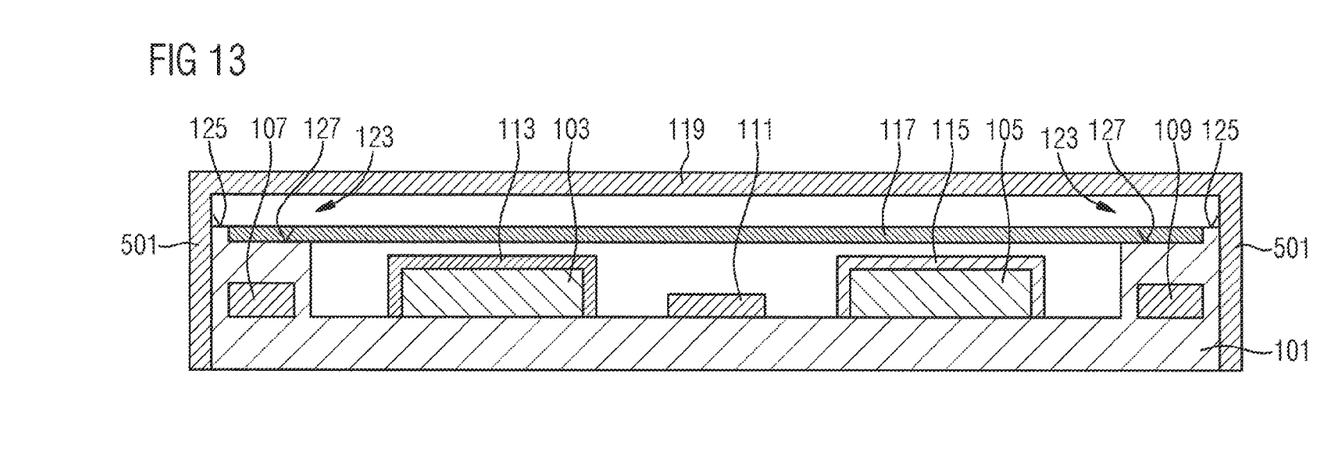

In accordance with FIG. 13, analogously to FIG. 5, a lens mount 119 with a lens (not shown) is subsequently fixed on the carrier 101. The lens mount 119 with its lens and the carrier 101 act as or form a housing that encapsulates or receives the individual elements arranged on the carrier 101.

FIGS. 14 to 21 respectively show a lighting device 129.

Figure 14:
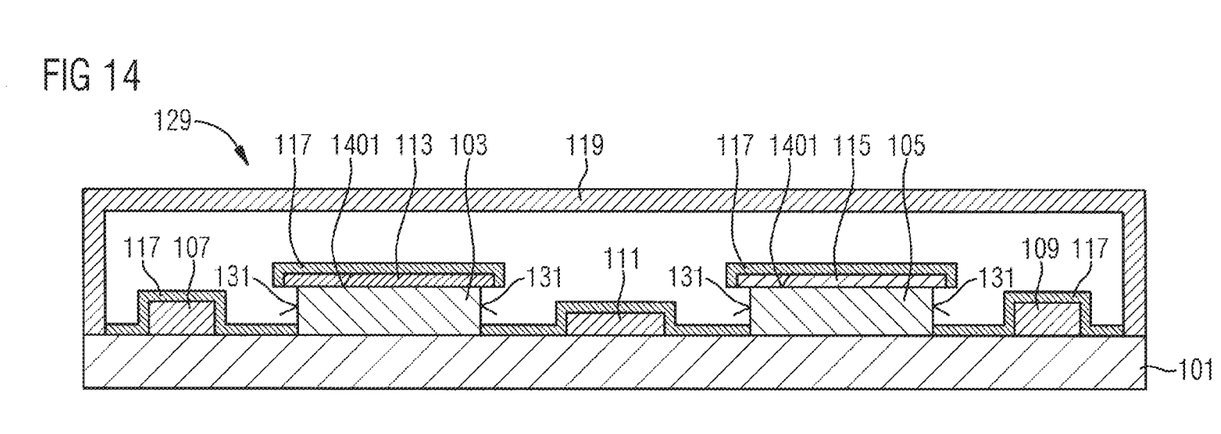
FIGS. 14 to 21 respectively show a lighting device.

The lighting device 129 in accordance with FIG. 14 substantially corresponds to the embodiment shown in FIG. 5. As a difference, opposite side faces 131 of the illuminants 103, 105 comprise no conversion layer 113 and 115, respectively, and also no color scattering layer 117. This was brought about in particular by virtue of the fact that the corresponding conversion layer 113, 115 was applied, for example adhesively bonded, respectively on a surface 1401 of the illuminants 103, 105 facing away from the carrier 101, but not on the side faces 131, wherein a dedicated color scattering layer 117 subsequently was respectively applied, for example adhesively bonded, on the applied conversion layers 113, 115. In this regard, the side faces 131 thus remained free of a conversion layer and a color scattering layer.

Figure 15:
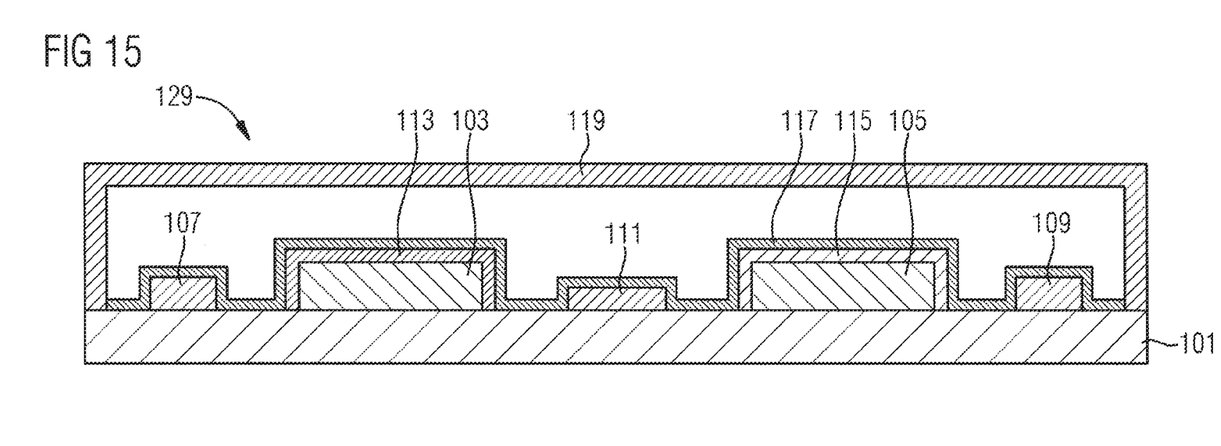
Figure 16:
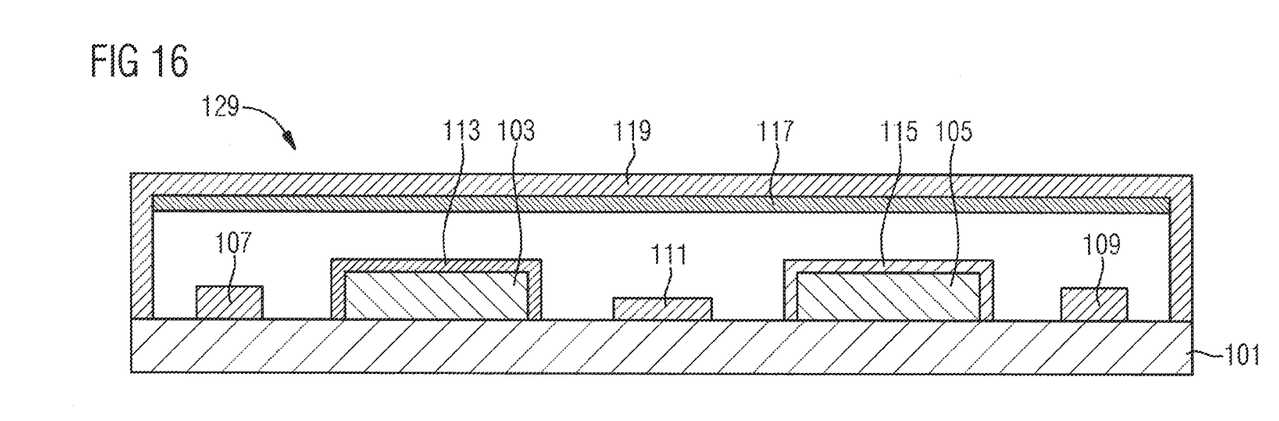
Figure 17:
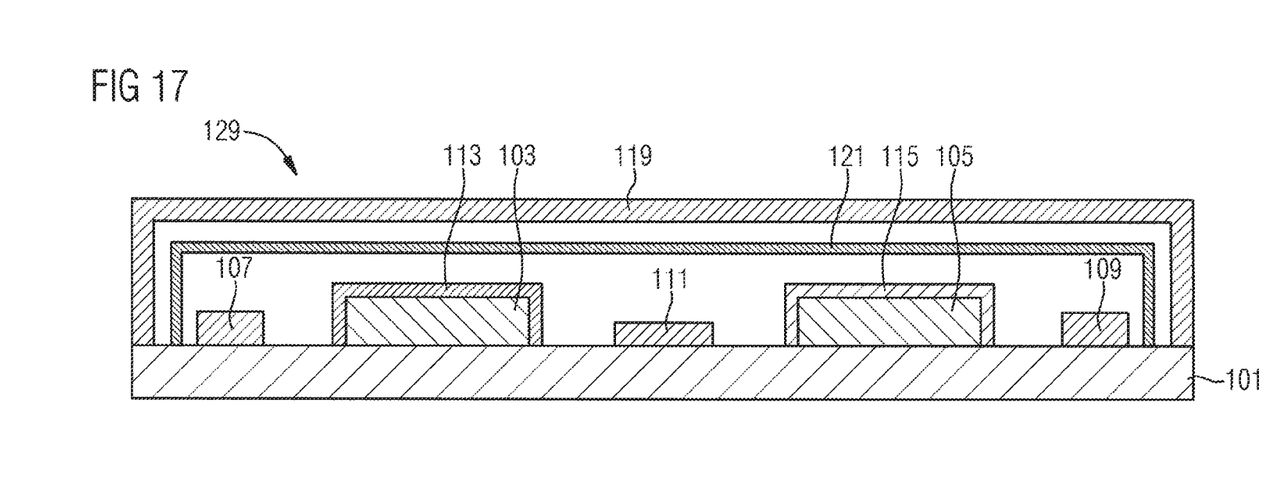
Figure 18:
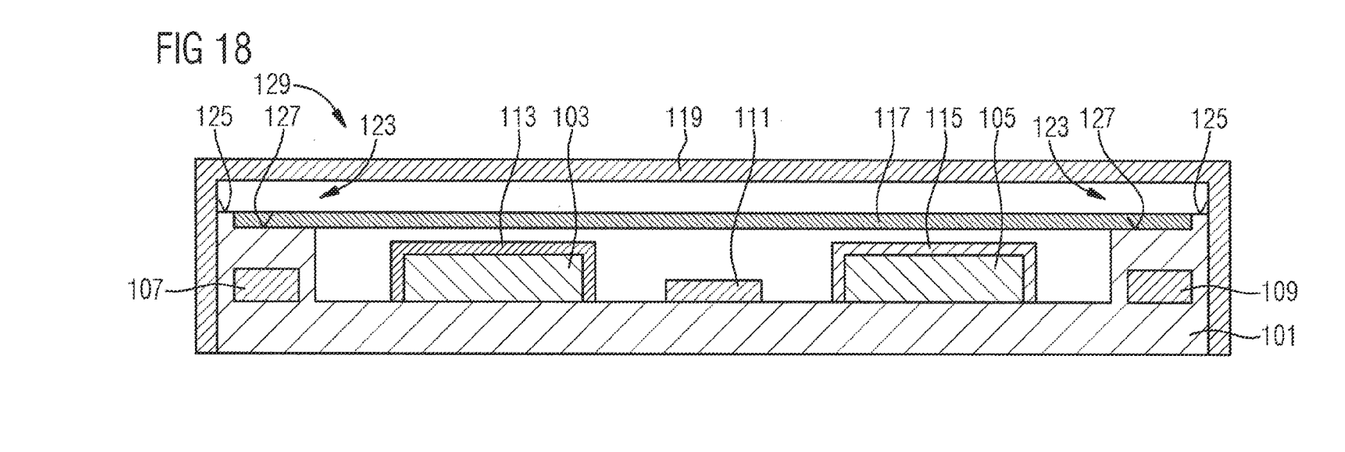

FIG. 15 shows the lighting device 129 at the point in time of the production method in accordance with FIG. 5. FIG. 16 shows the lighting device 129 at the point in time of the production method in accordance with FIG. 8. FIG. 17 shows the lighting device 129 at the point in time of the production method in accordance with FIG. 7. FIG. 18 shows the lighting device 129 at the point in time of the production method in accordance with FIG. 13.

Figure 19:
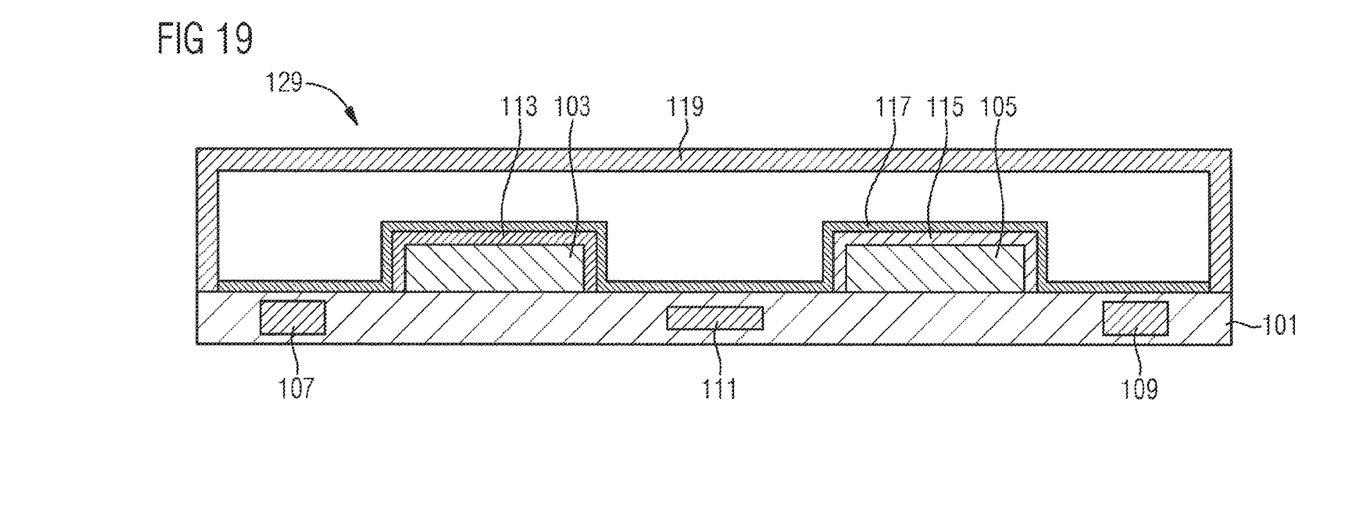
Figure 20:
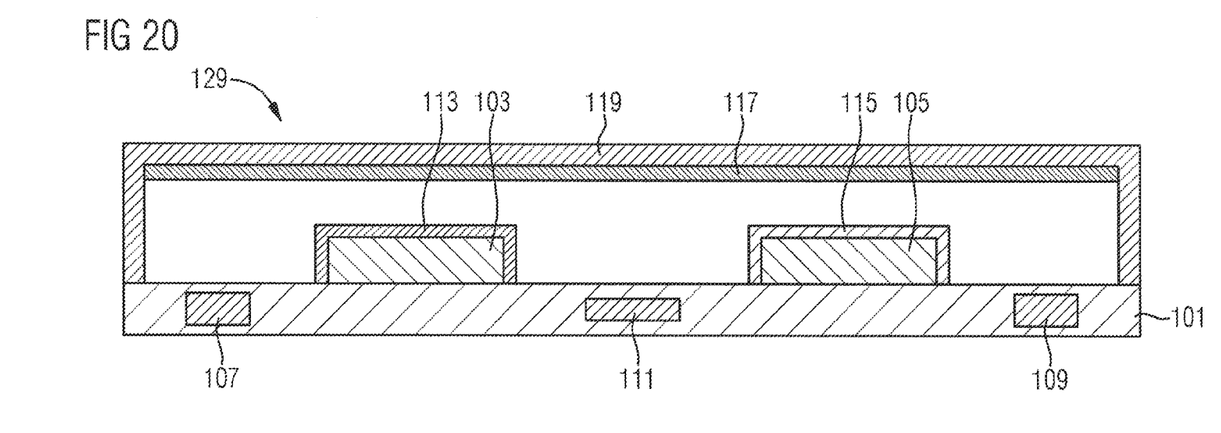
Figure 21:
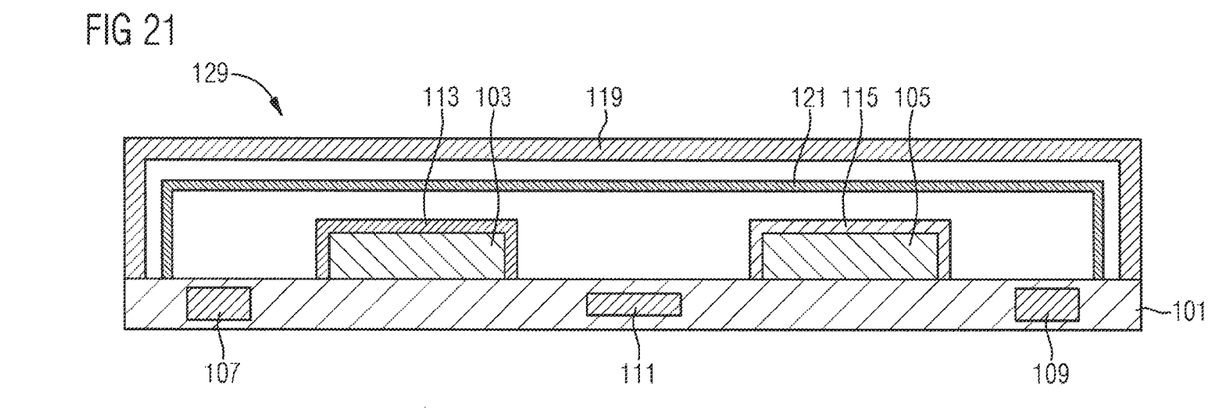

FIGS. 19 to 21 respectively show a lighting device 129 substantially analogous to the embodiments in accordance with the points in time of production in FIG. 5 (for FIG. 19) and respectively FIG. 8 (for FIG. 20) and respectively FIG. 7 (for FIG. 21). As a difference, here the two protective diodes 107, 109 and the temperature sensor 111 are arranged in the carrier 101, in particular potted or molded in the latter.

Although the invention has been more specifically illustrated and described in detail by means of the preferred exemplary embodiments, nevertheless the invention is not restricted by the examples disclosed and other variations may be derived therefrom by the person skilled in the art, without departing from the scope of protection of the invention.

The invention claimed is:

1. A lighting device comprising:
   a carrier;
   at least one optoelectronic illuminant arranged on the carrier, the illuminant configured to emit light into an emission area;
   a further electronic component arranged on the carrier, wherein the further electronic component is a protective diode or a temperature sensor; and
   a color scattering layer located in the emission area, the color scattering layer configured to generate a color by scattering of light at a surface of the color scattering layer facing away from the illuminant,
   wherein the illuminant comprises a sprayed-on conversion layer, on which the color scattering layer is directly sprayed, and
   wherein the color scattering layer is directly sprayed onto the further electronic component and
   onto an area of the carrier that is situated between the illuminant and the further electronic component.

2. The lighting device according to claim 1, wherein the color scattering layer is arranged in the emission area by a holding unit, and wherein the holding unit is formed separately from the illuminant and holds the color scattering layer.

3. The lighting device according to claim 2, wherein the holding unit comprises a frame that receives the color scattering layer and is fixed on the carrier.

4. The lighting device according to claim 2, wherein the color scattering layer comprises a glass layer coated with a color scattering medium and/or a ceramic layer, or wherein the color scattering layer is formed from a glass layer and/or a ceramic layer, respectively.

5. A method for producing a lighting device, the method comprising:
   arranging an optoelectronic illuminant for emitting light into an emission area on a carrier;
   arranging a further electronic component on the carrier, wherein the further electronic component is a protective diode or a temperature sensor;
   spraying a conversion layer onto the illuminant; and
   forming a color scattering layer for generating a color by a scattering of light at a surface of the color scattering layer facing away from the illuminant into the emission area,
   wherein forming the color scattering layer comprises directly spraying the color scattering layer onto the further electronic component and onto an area of the carrier situated between the illuminant and the further electronic component, and
   onto the conversion layer.

6. The method according to claim 5, wherein forming the color scattering layer comprises arranging the color scattering layer in the emission area by a holding unit, and wherein the holding unit is formed separately from the illuminant and holds the color scattering layer.

7. The method according to claim 6, wherein the holding unit comprises a frame that receives the color scattering layer and is fixed on the carrier.

8. The method according to claim 6, wherein the color scattering layer comprises at least one of a glass layer or ceramic layer coated with at least one of a color scattering medium or a ceramic coating layer.

* * * * *